United States Patent
Masuda et al.

(10) Patent No.: US 7,569,498 B2
(45) Date of Patent: Aug. 4, 2009

(54) MANUFACTURING METHOD OF SEMICONDUCTOR DEVICE

(75) Inventors: Hideaki Masuda, Yokohama (JP); Hideshi Miyajima, Yokohama (JP); Tsutomu Shimayama, Kanagawa (JP)

(73) Assignees: Kabushiki Kaisha Toshiba, Tokyo (JP); Sony Corporation, Tokyo (JP)

( * ) Notice: Subject to any disclaimer, the term of this patent is extended or adjusted under 35 U.S.C. 154(b) by 15 days.

(21) Appl. No.: 12/020,353

(22) Filed: Jan. 25, 2008

(65) Prior Publication Data
US 2008/0194117 A1  Aug. 14, 2008

(30) Foreign Application Priority Data
Jan. 26, 2007  (JP)  ............... 2007-016778

(51) Int. Cl.
*H01L 21/469* (2006.01)
(52) U.S. Cl. ...................................... 438/780
(58) Field of Classification Search ................. 438/780, 438/781
See application file for complete search history.

(56) References Cited

U.S. PATENT DOCUMENTS 6,596,467 B2 7/2003 Gallagher et al.
7,208,389 B1 * 4/2007 Tipton et al. ............... 438/409
2002/0187625 A1 12/2002 Shimooka et al.
2005/0250311 A1 11/2005 Miyajima et al.
2007/0093052 A1 4/2007 Shimooka et al.

FOREIGN PATENT DOCUMENTS

| JP | 2004-509468 | 3/2004 |
| JP | 2004-274020 | 9/2004 |
| JP | 2004-320005 | 11/2004 |
| JP | 2006-100833 | 4/2006 |

* cited by examiner

*Primary Examiner*—W. David Coleman
*Assistant Examiner*—Daniel Shook
(74) *Attorney, Agent, or Firm*—Finnegan, Henderson, Farabow, Garrett & Dunner, L.L.P.

(57) ABSTRACT

A manufacturing method of a semiconductor device, includes forming a porous organo-siloxane film containing a porogen component having carbon as a main component above a semiconductor substrate, forming an upper-side insulating film having at least one of film density and film composition different from that of the porous organo-siloxane film on the porous organo-siloxane film, and applying at least one of an electron beam and an ultraviolet ray to the porous organo-siloxane film and upper-side insulating film to cause polymerization reaction of the porogen component in the porous organo-siloxane film.

20 Claims, 3 Drawing Sheets

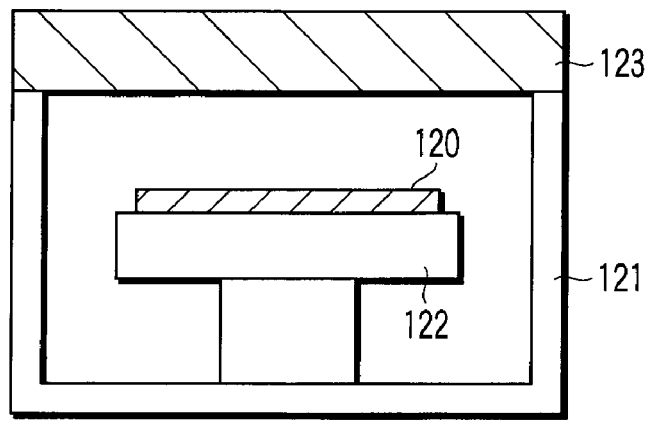
F I G. 7
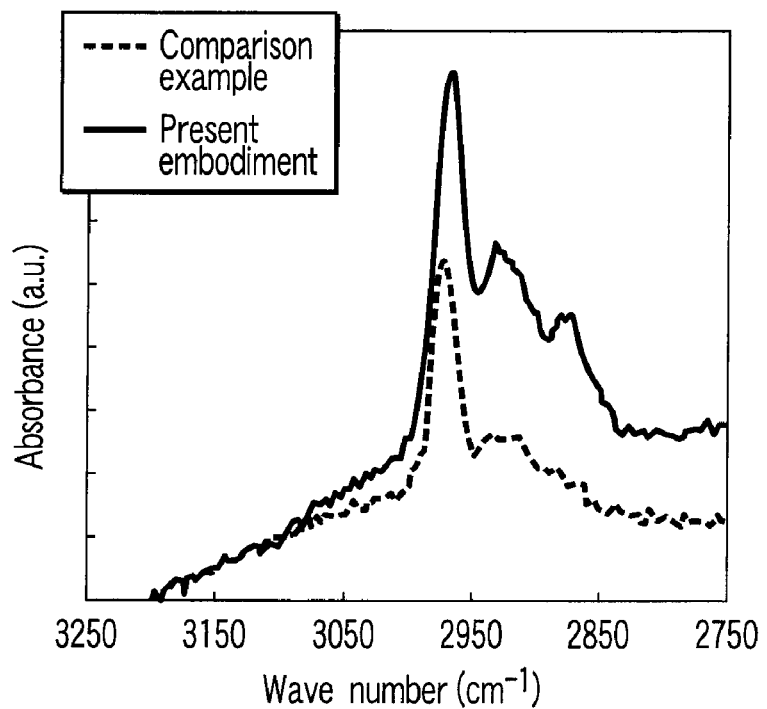
F I G. 8

MANUFACTURING METHOD OF SEMICONDUCTOR DEVICE

CROSS-REFERENCE TO RELATED APPLICATIONS

This application is based upon and claims the benefit of priority from prior Japanese Patent Application No. 2007-016778, filed Jan. 26, 2007, the entire contents of which are incorporated herein by reference.

BACKGROUND OF THE INVENTION

1. Field of the Invention

This invention relates to a manufacturing method of a semiconductor device.

2. Description of the Related Art

It is important to reduce the capacitance between wires, that is, lower the dielectric constant of insulating films in order to enhance the operation speed of a semiconductor device. An organo-siloxane film is widely used as the insulating film with the low dielectric constant, but it is proposed to use a porous insulating film having fine voids in the film to further lower the dielectric constant (for example, refer to Jpn. Pat. Appln. KOHYO Publication No. 2004-509468).

However, since the film density of the porous insulating film is low, etching gas easily penetrates into the film at the dry etching. When a porous organo-siloxane film is used as the porous insulating film, there occurs a problem that Si—O bonds and Si—CH$_3$ bonds in the film are broken by the etching gas and the film quality is degraded. The moisture absorbency of the porous organo-siloxane film increases due to the degradation of the film quality and this causes the characteristic of the semiconductor device to be degraded.

Thus, the porous organo-siloxane film is proposed as the insulating film with the low dielectric constant, but it is conventionally difficult to attain a porous organo-siloxane film of high quality.

BRIEF SUMMARY OF THE INVENTION

According to an aspect of the present invention, there is provided a manufacturing method of a semiconductor device, comprising: forming a porous organo-siloxane film containing a porogen component having carbon as a main component above a semiconductor substrate; forming an upper-side insulating film having at least one of film density and film composition different from that of the porous organo-siloxane film on the porous organo-siloxane film; and applying at least one of an electron beam and an ultraviolet ray to the porous organo-siloxane film and upper-side insulating film to cause polymerization reaction of the porogen component in the porous organo-siloxane film.

BRIEF DESCRIPTION OF THE SEVERAL VIEWS OF THE DRAWING

FIG. 7 is a view schematically showing the structure of an electron beam application apparatus used for formation of a porous organo-siloxane film.

FIG. 8 is a diagram showing the remaining amount of a porogen component.

DETAILED DESCRIPTION OF THE INVENTION

There will now be described an embodiment of this invention with reference to the accompanying drawings.

FIGS. 1 to 5 are cross sectional views schematically showing the manufacturing steps of a semiconductor device according to an embodiment of this invention.

Figure 1:
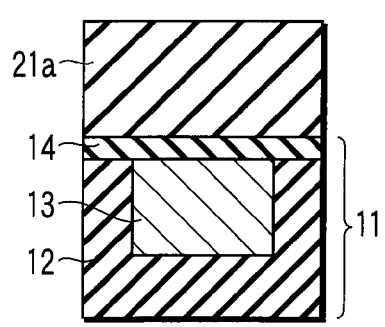
FIGS. 1 to 5 are cross sectional views schematically showing the manufacturing steps of a semiconductor device according to an embodiment of this invention.

First, as shown in FIG. 1, an underlying region 11 including an interlayer insulating film 12, copper wire 13 and diffusion prevention film 14 is formed. The diffusion prevention film 14 is used to prevent diffusion of copper in the copper wire 13 and is formed of an SiC film, for example. Although not shown in the drawing, a semiconductor substrate on which semiconductor elements such as MIS transistors are formed is present under the underlying region 11.

Next, an organo-siloxane film 21a having a matrix component containing silicon, oxygen and carbon as a main component and a porogen component containing carbon as a main component is formed on the underlying region 11. The organo-siloxane film 21a is formed by use of a PE-CVD (plasma enhanced chemical vapor deposition) method using organo-silicon gas (organo-silane gas) for formation of a matrix component and gas containing hydrocarbon as a main component for formation of a porogen component. Next, the method for forming the organo-siloxane film 21a is concretely explained.

Figure 6:
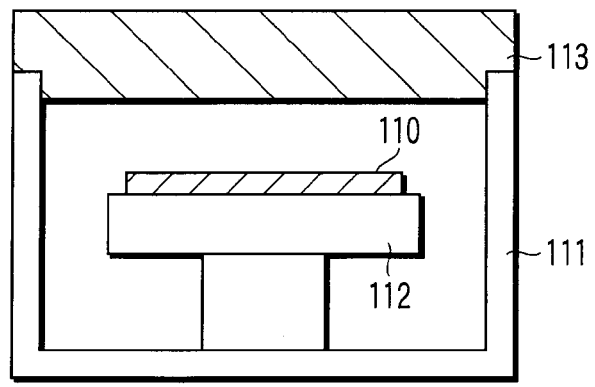
FIG. 6 is a view schematically showing the structure of a reaction apparatus used for formation of an organo-siloxane film.

FIG. 6 is a view schematically showing the structure of a reaction apparatus (PE-CVD apparatus) used for formation of the organo-siloxane film 21a. A reference symbol 110 denotes a wafer having the underlying regions 11 shown in FIG. 1, 111 a chamber, 112 a lower-side electrode having a heating mechanism and 113 an upper-side electrode.

First, the wafer 110 is carried into the chamber 111 in which a highly vacuum state of 10 Torr or less can be maintained and the wafer 110 is placed on the lower-side electrode 112. Then, the wafer 110 is heated to approximately 250° C. by the heating mechanism provided in the lower-side electrode 112.

After this, mixed gas containing methyl-di-ethoxy-silane, alpha-terpinene, O$_2$ and He is introduced into the chamber 111. The methyl-di-ethoxy-silane is gas used for formation of the matrix component and the alpha-terpinene is gas used for formation of the porogen component. High-frequency power is supplied to the lower-side electrode 112 and upper-side electrode 113 to generate plasma while the pressure in the chamber 111 is kept constant. Thus, an organo-siloxane film 21a is formed on the surface of the wafer 110. At this time, the alpha-terpinene contained in the mixed gas is polymerized by the plasma to form an organic polymer. The organic polymer is porogen and uniformly taken into the organo-siloxane film 21a.

As the organo-silicon gas used for formation of the matrix component, at least one of di-methyl-silane, tri-methyl-silane, tetra-methyl-silane, di-methyl-phenyl-silane, tri-methyl-silyl-acetylene, mono-methyl-di-ethoxy-silane, di-methyl-di-ethoxy-silane, tetra-methyl-cyclo-tetra-siloxane and octa-methyl-cyclo-tetra-siloxane can be used.

Further, as the gas used for formation of the porogen component, at least one of methane, ethylene, propylene, alpha-terpinene, gamma-terpinene and limonene can be used.

Figure 2:
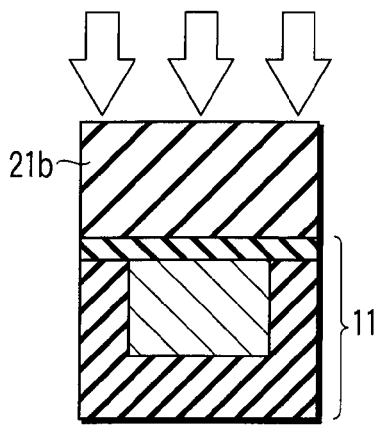

Next, as shown in FIG. 2, electron beams or ultraviolet rays are applied to the organo-siloxane film 21a to remove part of the porogen component. As a result, a porous organo-siloxane film 21b having a matrix component containing silicon, oxygen and carbon as a main component and a porogen component containing carbon as a main component can be attained. That is, the organo-siloxane film 21b having a large number of voids can be obtained. The method for forming the porous organo-siloxane film 21b is concretely explained below. In the present embodiment, a case wherein electron beams are applied to the organo-siloxane film 21a is explained.

FIG. 7 is a view schematically showing the structure of an electron beam application apparatus used for formation of the porous organo-siloxane film 21b. A reference symbol 120 denotes a wafer having the structure shown in FIG. 1 or 2, 121 a chamber, 122 a wafer stage having a heating mechanism and 123 an electron beam emitting unit.

First, the wafer 120 is carried into the chamber 121 and the wafer 120 is placed on the wafer stage 122. The wafer 120 is heated to approximately 350° C. by the heating mechanism provided in the wafer stage 122. Then, Ar gas is introduced into the chamber 121. Electron beams are applied to the wafer 120 from the electron beam emitting unit 123 while the pressure in the chamber 121 is kept constant. As a result, part of the porogen component is removed from the organo-siloxane film 21a and a porous organo-siloxane film 21b can be attained. That is, voids are formed by removing the porogen component and the porous organo-siloxane film 21b can be obtained. Further, since only part of the porogen component is removed from the organo-siloxane film 21a, the porogen component remains in the porous organo-iloxane film 21b.

As described above, in the present embodiment, part of the porogen component remains in the porous organo-siloxane film 21b. In order to thus leave part of the porogen component behind in the porous organo-siloxane film 21b, the film formation condition of the organo-siloxane film 21a of FIG. 1 and the condition of application of electron beams shown in FIG. 2 are adjusted. The film formation condition of the organo-siloxane film 21a includes the type of film formation gas, the flow rate of film formation gas, high-frequency power, heating temperature of the wafer and the like. The condition of application of the electron beams includes the dose amount of applied electrons, the dose rate of applied electrons, acceleration voltage of applied electrons, heating temperature of the wafer and the like. In the present embodiment, part of the porogen component is left behind in the porous organo-siloxane film 21b by setting the wafer heating temperature at the time of electron beam application to approximately 350° C. When the operation of applying ultraviolet rays instead of electron beams is performed, part of the porogen component can be left behind in the porous organo-siloxane film 21b by adjusting the condition of application of ultraviolet rays. The condition of application of ultraviolet rays includes a light amount of ultraviolet rays, light intensity of ultraviolet rays, wavelength spectrum distribution of ultraviolet rays, heating temperature of the wafer and the like.

FIG. 8 is a diagram showing the remaining amount of the porogen component after application of electron beams in FIG. 2. Specifically, the FT-IR spectrum of the porous organo-siloxane film obtained after application of electron beams is shown. In the present embodiment, the wafer heating temperature at the time of application of electron beams is set at approximately 350° C. and the wafer heating temperature at the time of application of electron beams in the comparison example is set at approximately 400° C. As shown in FIG. 8, in this embodiment, the peak area in a portion near the wave number 2800 to 3200 $cm^{-1}$ caused by porogen is made large. In this case, the relative dielectric constant of the porous organo-siloxane film of the present embodiment is approximately 2.40 and the relative dielectric constant of the porous organo-siloxane film of the comparison example is approximately 2.35.

Figure 3:
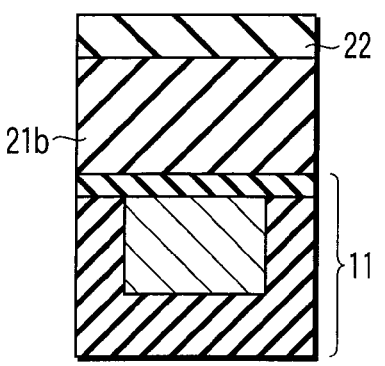

Next, as shown in FIG. 3, an organo-siloxane film 22 whose film density is different from the film density of the porous organo-siloxane film 21b is formed as an upper-side insulating film on the porous organo-siloxane film 21b. It is preferable that the film density of the organo-siloxane film 22 be higher than the film density of the porous organo-siloxane film 21b. The organo-siloxane film 22 contains a matrix component having silicon, oxygen and carbon as a main component, but it may or may not contain a porogen component. Further, it is preferable that the film density of the organo-siloxane film 22 be higher than the film density of the organo-siloxane film 21a formed in the step of FIG. 1.

It is preferable that the organo-siloxane film 22 be made thinner than the porous organo-siloxane film 21b. For example, the thickness of the organo-siloxane film 22 is set to approximately 1/10 of the thickness of the porous organo-siloxane film 21b.

The organo-siloxane film 22 is formed by the PE-CVD method. The structure of the reaction apparatus (PE-CVD apparatus) used for formation of the organo-siloxane film 22 is the same as that of the reaction apparatus shown in FIG. 6. The organo-silane gas described in the step of FIG. 1 can be used as organo-silane gas for formation of a matrix component. Also, the porogen component forming gas described in the step of FIG. 1 can be used as gas for formation of an porogen component. In the present embodiment, the organo-siloxane film 22 is formed by use of mixed gas containing methyl-di-ethoxy-silane, $O_2$ and He.

Figure 4:
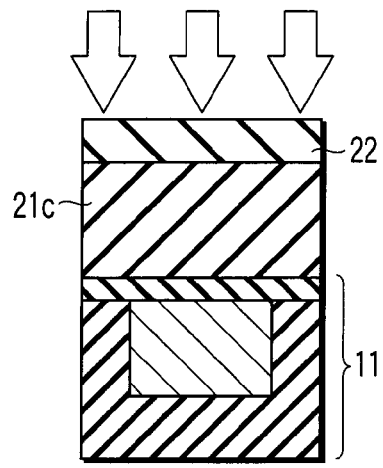

Next, as shown in FIG. 4, electron beams or ultraviolet rays are applied to the porous organo-siloxane film 21b and organo-siloxane film (upper-side insulating film) 22. As a result, the porous organo-siloxane film 21b is modified into a porous organo-siloxane film 21c.

Since the organo-siloxane film 22 with high density is formed on the porous organo-siloxane film 21b when electron beams or ultraviolet rays are applied thereto, the organo-siloxane film 22 functions as a cap film. Therefore, removal of the porogen component contained in the porous organo-siloxane film 21b can be suppressed by the presence of the organo-siloxane film 22. As a result, polymerization reaction of the porogen component in the porous organo-siloxane film 21b can be accelerated. Specifically, polymerization reaction of the porogen components with one another and polymerization reaction of the porogen component with the matrix component are accelerated by applying electron beams or ultraviolet rays. Since the polymerization reaction is thus caused, the film quality of the porous organo-siloxane film 21c can be prevented from being degraded in the dry etching step performed later. As a result, occurrence of the problem that the moisture absorbency of the porous organo-siloxane film 21c increases can be prevented and the characteristic of the semiconductor device can be effectively prevented from being degraded.

In the present embodiment, the wafer heating temperature is set to approximately 400° C. and electron beams are applied to the porous organo-siloxane film 21b and organo-siloxane film 22 by use of an electron beam application apparatus as shown in FIG. 7. It is preferable to set the wafer heating temperature (heating temperatures of the porous organo-siloxane film 21b and organo-siloxane film 22) equal to or higher than 300° C.

Figure 9:
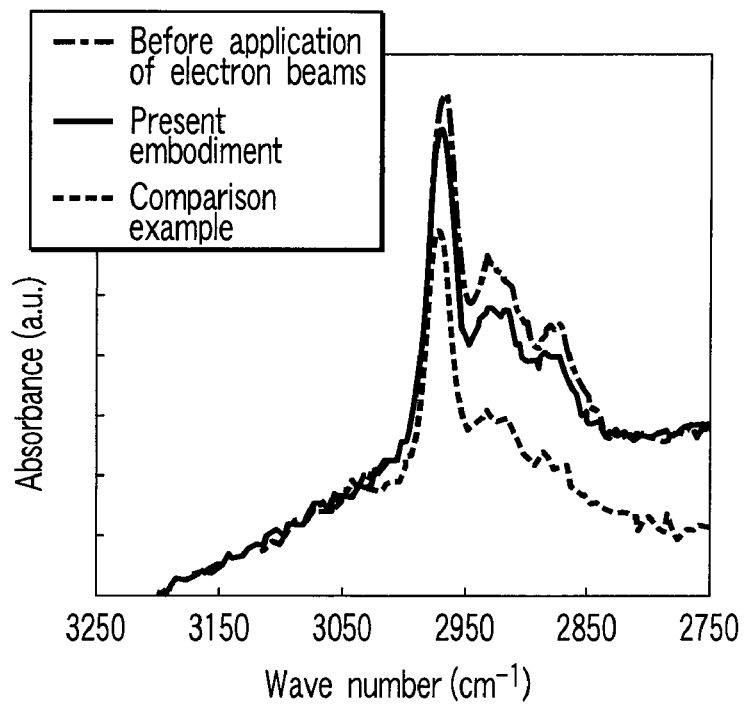
FIG. 9 is a diagram showing the remaining amount of a porogen component.

FIG. 9 is a diagram showing the remaining amount of a porogen component obtained after application of electron beams of FIG. 4. Specifically, FIG. 9 is a diagram showing the FT-IR spectrum of a porous organo-siloxane film after application of electron beams. In the present embodiment, the organo-siloxane film 22 is formed, but the organo-siloxane film 22 is not formed in the comparison example. As shown in FIG. 9, in the present embodiment, a reduction in the peak area in a portion near the wave number 2800 to 3200 $cm^{-1}$ caused by porogen does not almost occur after application of electron beams. This is because removal of the porogen component from the porous organo-siloxane film 21b is effectively suppressed by the organo-siloxane film 22.

It is preferable that the film density of the organo-siloxane film 22 be set higher than that of the porous organo-siloxane film 21c after application of electron beams or ultraviolet rays in the step of FIG. 4. Specifically, it is preferable to set the film density of the organo-siloxane film 22 higher than or equal to 1.2 $g/cm^3$ after the step of FIG. 4. Further, it is preferable to set the relative dielectric constant of the porous organo-siloxane film 21c lower than or equal to 2.50 after the step of FIG. 4.

Figure 5:
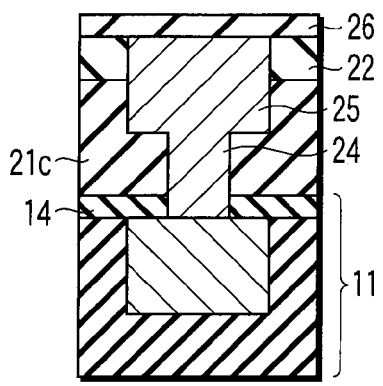

Next, as shown in FIG. 5, the diffusion prevention film 14, porous organo-siloxane film 21c and organo-siloxane film 22 are processed by a dry etching process to form a via hole and wiring trench therein. By the reason already described, the film quality of the porous organo-siloxane film 21c is prevented from being degraded in the dry etching step. After this, copper is filled into the via hole and wiring trench to form a via plug 24 and copper wire 25. Further, an SiC film is formed on the organo-siloxane film 22 and copper wire 25 as a diffusion prevention film 26.

The thus formed semiconductor device is evaluated, but a rise in the resistance of the via plug 24 and degradation in the electrical characteristic due to the stress migration cannot be observed. This is because the porous organo-siloxane film 21c with the excellent quality is formed by use of the above method.

As described above, in the present embodiment, the organo-siloxane film 22 functions as a cap film when electron beams or ultraviolet rays are applied in the step of FIG. 4. Therefore, removal of the porogen component from the porous organo-siloxane film 21b can be suppressed and the polymerization reaction of the porogen component in the porous organo-siloxane film 21b is accelerated. As a result, degradation in the film quality of the porous organo-siloxane film 21c in the dry etching step or the like can be effectively prevented. Further, since a large number of voids are present in the porous organo-siloxane film 21c, the dielectric constant of the porous organo-siloxane film 21c can be kept low. Therefore, according to the present embodiment, the porous organo-siloxane film 21c with the excellent quality can be attained and a semiconductor device with the high reliability and excellent characteristics can be formed.

In the above embodiment, the organo-siloxane film 21a and organo-siloxane film 22 are formed by use of the PE-CVD method, but the organo-siloxane film 21a and organo-siloxane film 22 can be formed by use of a coating method. For example, when the organo-siloxane film 21a is formed by use of the coating method, a solution containing a matrix component forming polymer having silicon, oxygen and carbon as a main component and a porogen component forming polymer having carbon as a main component may be coated. Further, a solution containing a matrix component forming polymer with a porogen component having carbon as a main component as a substituent (a matrix component forming polymer having silicon, oxygen and carbon as a main component) may be coated. When the organo-siloxane film 21a and organo-siloxane film 22 are thus formed by use of the coating method, the same effect as that of the above embodiment can be attained.

In the above embodiment, the organo-siloxane film whose film density is different from that of the porous organo-siloxane film 21b is used as the upper-side insulating film 22 formed on the porous organo-siloxane film 21b, but an insulating film having a film composition different from that of the porous organo-siloxane film 21b can be used as the upper-side insulating film 22. For example, as the upper-side insulating film 22, an inorgano-siloxane film (inorganic-siloxane film), SiC film, SiCN film or poly arylene film can be used. Also, in this case, since the upper-side insulating film 22 functions as a cap film, removal of the porogen component from the porous organo-siloxane film 21b can be prevented and the same effect as that of the above embodiment can be attained.

Further, in the embodiment described above, a porogen component may be introduced into the porous organo-siloxane film 21b after the porous organo-siloxane film 21b is formed in the step of FIG. 2. For example, the surface of the porous organo-siloxane film 21b is exposed to the gas atmosphere containing the porogen component so as to introduce the porogen component into the porous organo-siloxane film 21b from the gas atmosphere. Alternatively, a solution containing a porogen component can be coated on the surface of the porous organo-siloxane film 21b so as to introduce the porogen component into the porous organo-siloxane film 21b from the solution.

When the porogen component is introduced into the porous organo-siloxane film 21b, the following manufacturing method can be applied. In the embodiment described above, part of the porogen component in the organo-siloxane film 21a is removed when the porous organo-siloxane film 21b is formed in the step of FIG. 2. However, it is also possible to remove substantially the entire porogen component in the organo-siloxane film 21a and then introduce the porogen component into the porous organo-siloxane film 21b when the porous organo-siloxane film 21b is formed in the step of FIG. 2.

That is, when the method for introducing the porogen component into the porous organo-siloxane film 21b is used, a porogen component may be introduced into a preliminary porous organo-siloxane film having at least a matrix component. In this case, a porogen component may be or may not be contained in the preliminary porous organo-siloxane film. Thus, when the method for introducing the porogen component into the porous organo-siloxane film 21b is used, the same effect as that of the above embodiment can be attained.

Figure 10:
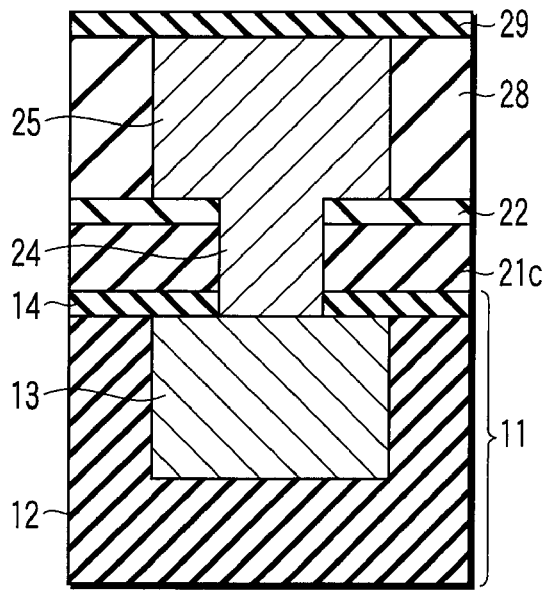
FIG. 10 is a cross sectional view schematically showing the structure of a semiconductor device according to a modification of the embodiment of this invention.

Further, the method of the above embodiment can be applied to a method for formation of the wiring structure as shown in FIG. 10. In the structure shown in FIG. 10, an organic insulating film (additional insulating film) 28 is formed on the organo-siloxane film 22. A via plug 24 is formed in a via hole provided in the diffusion prevention film 14, porous organo-siloxane film 21c and organo-siloxane film 22 and a copper wire 25 is formed in a wiring trench provided in the organic insulating film 28. An SiC film is formed as a diffusion prevention film 29 on the copper wire 25 and organic insulating film 28. With this structure, application of electron beams or ultraviolet rays for causing the polymerization reaction of the porogen component may be performed after formation of the organo-siloxane film 22 and before formation of the organic insulating film 28. However, electron beams or ultraviolet rays may be applied after the organic insulating film 28 has been formed. Thus, when electron beams or ultraviolet rays are applied after the organic insulating film 28 has been formed, the same effect as that described in the above embodiment can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
   forming a porous organo-siloxane film containing a porogen component having carbon as a main component above a semiconductor substrate;
   forming an upper-side insulating film having at least one of film density and film composition different from that of the porous organo-siloxane film on the porous organo-siloxane film; and
   applying at least one of an electron beam and an ultraviolet ray to the porous organo-siloxane film and upper-side insulating film to cause polymerization reaction of the porogen component in the porous organo-siloxane film.

2. The method according to claim 1, wherein forming the porous organo-siloxane film includes:
   forming an organo-siloxane film containing a matrix component having silicon, oxygen and carbon as a main component and the porogen component having carbon as a main component; and
   removing part of the porogen component from the organo-siloxane film.

3. The method according to claim 2, wherein the part of the porogen component is removed by applying at least one of an electron beam and an ultraviolet ray to the organo-siloxane film.

4. The method according to claim 2, wherein the organo-siloxane film is formed by using one of a CVD method and a coating method.

5. The method according to claim 1, wherein forming the porous organo-siloxane film includes:
   forming a preliminary porous organo-siloxane film containing a matrix component having silicon, oxygen and carbon as a main component; and
   introducing the porogen component having carbon as a main component into the preliminary porous organo-siloxane film.

6. The method according to claim 5, wherein introducing the porogen component into the preliminary porous organo-siloxane film includes exposing a surface of the preliminary porous organo-siloxane film to gas atmosphere containing the porogen component.

7. The method according to claim 5, wherein introducing the porogen component into the preliminary porous organo-siloxane film includes coating a solution containing the porogen component on a surface of the preliminary porous organo-siloxane film.

8. The method according to claim 1, wherein the upper-side insulating film is formed by using one of a CVD method and a coating method.

9. The method according to claim 1, wherein forming the upper-side insulating film on the porous organo-siloxane film includes forming the upper-side insulating film having film density higher than film density of the porous organo-siloxane film on the porous organo-siloxane film.

10. The method according to claim 1, wherein film density of the upper-side insulating film after applying at least one of the electron beam and the ultraviolet ray is higher than film density of the porous organo-siloxane film after applying at least one of the electron beam and the ultraviolet ray.

11. The method according to claim 1, wherein the upper-side insulating film is formed of an organo-siloxane film.

12. The method according to claim 1, wherein the upper-side insulating film is formed of an organo-siloxane film whose film density is set not lower than 1.2 g/cm$^3$ after at least one of the electron beam and the ultraviolet ray is applied.

13. The method according to claim 1, wherein the upper-side insulating film is formed of one of an inorgano-siloxane film, SiC film, SiCN film and poly arylene film.

14. The method according to claim 1, wherein a relative dielectric constant of the porous organo-siloxane film after applying at least one of the electron beam and the ultraviolet ray is not greater than 2.50.

15. The method according to claim 1, wherein the upper-side insulating film is formed thinner than the porous organo-siloxane film.

16. The method according to claim 1, wherein the upper-side insulating film suppresses the porogen component from being removed from the porous organo-siloxane film in applying at least one of the electron beam and the ultraviolet ray.

17. The method according to claim 1, wherein the polymerization reaction includes at least one of polymerization reaction of the porogen components contained in the porous organo-siloxane film and polymerization reaction of the porogen component with a matrix component contained in the porous organo-siloxane film.

18. The method according to claim 1, wherein the porous organo-siloxane film and the upper-side insulating film are heated in applying at least one of the electron beam and the ultraviolet ray.

19. The method according to claim 1, further comprising dry-etching the porous organo-siloxane film and the upper-side insulating film to which at least one of the electron beam and the ultraviolet ray has been applied.

20. The method according to claim 1, further comprising forming an additional insulating film on the upper-side insulating film,
   wherein applying at least one of the electron beam and the ultraviolet ray is performed after forming the additional insulating film.

* * * * *